(12) United States Patent
Tachibana et al.

(10) Patent No.: US 6,628,345 B1
(45) Date of Patent: Sep. 30, 2003

(54) AUTOMATIC FREQUENCY TUNING CIRCUIT

(75) Inventors: Masanori Tachibana, Tokyo (JP); Junji Suzuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 407 days.

(21) Appl. No.: 09/708,446

(22) Filed: Nov. 9, 2000

(30) Foreign Application Priority Data

Jun. 23, 2000 (JP) ........................................ 2000-190208

(51) Int. Cl.[7] ................................................. H04N 5/50
(52) U.S. Cl. ........................................ 348/735; 348/536
(58) Field of Search ................................ 348/735, 536, 348/537, 539; 375/344; 455/114.1, 173.1, 192.1, 192.2, 192.3; H04N 5/50

(56) References Cited

U.S. PATENT DOCUMENTS 4,302,778 A * 11/1981 Tanaka ........................ 348/735
6,211,920 B1 * 4/2001 Cirot et al. .................. 348/536

FOREIGN PATENT DOCUMENTS

| JP | 5-167398 | 7/1993 |
|----|----------|--------|
| JP | 6-113228 | 4/1994 |
| JP | 7-30375 | 1/1995 |
| JP | 10-276111 | 10/1998 |
| JP | 11-252478 | 9/1999 |

OTHER PUBLICATIONS

U.S. patent application Ser. No. 09/713,011, Hiroki Miyamoto, filed Nov. 16, 2000.

* cited by examiner

*Primary Examiner*—Sherrie Hsia
(74) *Attorney, Agent, or Firm*—Leydig, Voit & Mayer, Ltd.

(57) ABSTRACT

A multiplier circuit multiplies a first output signal ($f_{VCO}$) that has been generated by a conventional automatic phase-controlled loop circuit with a second output signal ($f_{IF}+f_{ref}$) that has been generated by a phase-locked loop circuit based on a reference signal ($f_{ref}$). A phase difference detector circuit and an edge detector circuit receive a result of this multiplication, and carry out an edge detection (such as, for example, a pulse density corresponding to a frequency difference between a video intermediate frequency $f_{IF}$ and the first output signal $f_{VCO}$). An automatic frequency tuning voltage is generated based on a result of this edge detection.

12 Claims, 7 Drawing Sheets

FIG. 3A PHASE DIFFERENCE DETECTOR CIRCUIT OUTPUT

WHEN FREQUENCY DIFFERENCE BETWEEN $f_{IF}$ AND $f_{VCO}$ IS LARGE

ERROR SIGNAL REPETITION PERIOD
(FREQUENCY DIFFERENCE BETWEEN $f_{IF}$ AND $f_{VCO}$)

FIG. 3B EDGE DETECTOR CIRCUIT OUTPUT

PULSE DENSITY IS HIGH

FIG. 3C INTEGRATED OUTPUT

REFERENCE VOLTAGE ← DC VOLTAGE IS HIGH

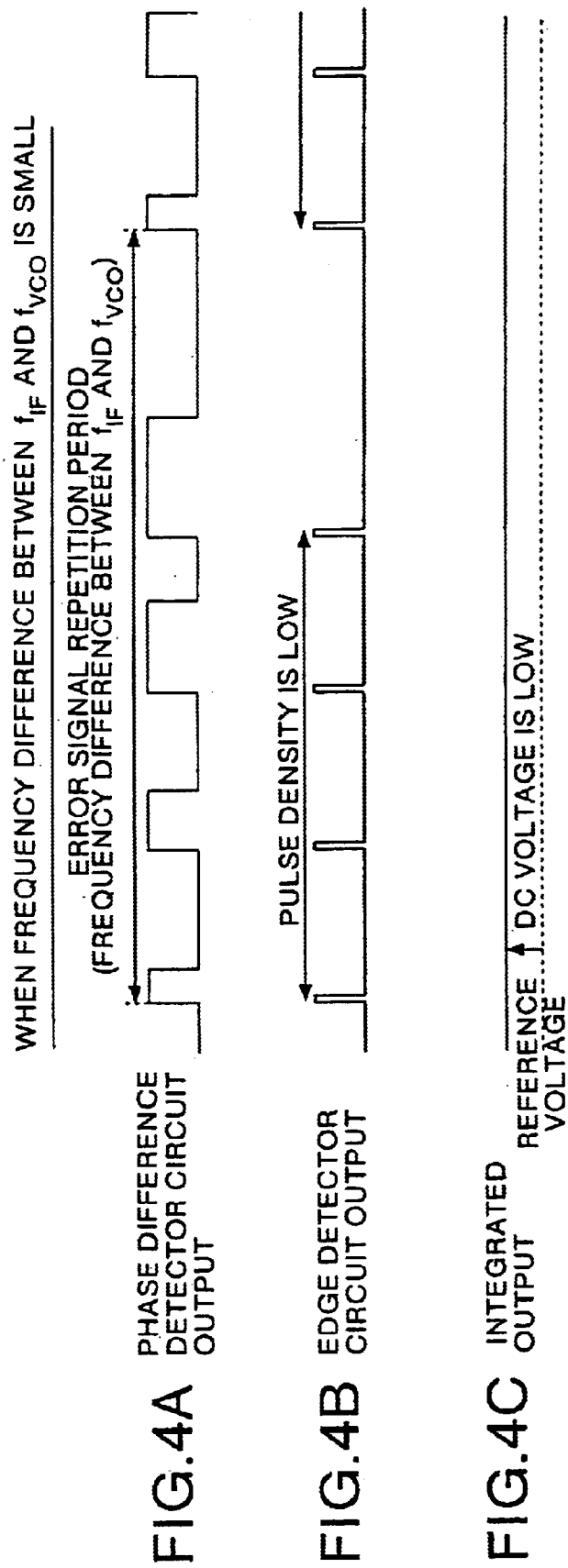

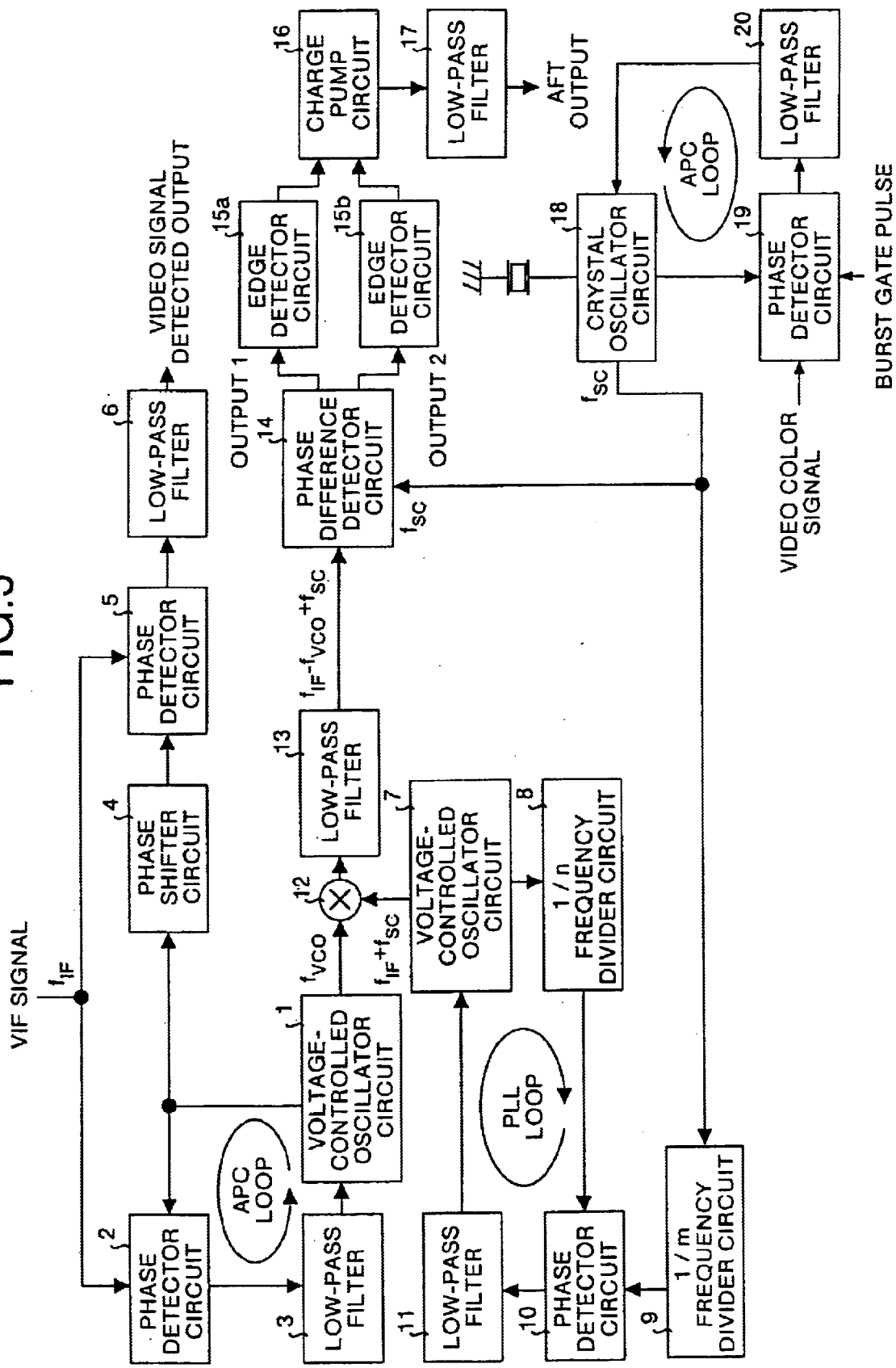

AUTOMATIC FREQUENCY TUNING CIRCUIT

FIELD OF THE INVENTION

The present invention relates to an automatic frequency tuning (AFT) circuit to be used in a television receiver.

BACKGROUND OF THE INVENTION

Generally, a television signal is tuned to a desired channel in a tuner of a television receiver, and is then converted into a video intermediate frequency signal based on an oscillation frequency of a local oscillator circuit so that the selected television signal becomes a carrier wave having a prescribed video intermediate frequency (for example 58.75 MHz in Japan). In the television receiver, in order to ensure that the oscillation frequency obtained from the local oscillator circuit becomes a real video intermediate frequency, the following feedback control is carried out. An AFT circuit detects a size of a difference between the frequency of the video intermediate frequency signal output from the tuner and the video intermediate frequency, and feeds back the detected result to the local oscillator circuit of the tuner, thereby feedback controlling the frequency of the video intermediate signal output from the tuner so that it becomes the video intermediate frequency.

The structure and operation of a conventional AFT circuit will be explained next. FIG. 7 is a block diagram showing a schematic structure of the conventional AFT circuit. The AFT circuit is constructed of a voltage-controlled oscillator circuit 1 capable of controlling an oscillation frequency based on a voltage, a phase detector circuit 2 for phase detecting a video intermediate frequency signal (hereinafter to be referred to as a VIF signal) output from a tuner (not shown) of a television receiver and an output signal of the voltage-controlled oscillator circuit 1, a low-pass filter 3 for integrating an output signal of the phase detector circuit 2, a phase shifter circuit 4 for shifting the phase of the output signal of the phase detector circuit 2, a phase detector circuit 5 for detecting phase of an output of the VIF signal and the phase shifter circuit 4, and a low-pass filter 6 for removing an unnecessary component of a video signal detected by the phase detector circuit 5.

The AFT circuit also includes a reference voltage circuit 21 for generating a reference voltage, a voltage comparator circuit 22 for comparing the reference voltage generated by the reference voltage circuit 21 with a voltage of the output signal of the low-pass filter 3, and a low-pass filter 23 for integrating an output signal of the voltage comparator circuit 22. The oscillation frequency of the voltage-controlled oscillator circuit 1 is expressed as $f_{VCO}$ and a predetermined video intermediate frequency is expressed as $f_{IF}$.

The voltage-controlled oscillator circuit 1, the phase detector circuit 2 and the low-pass filter 3 constitute an APC (automatic phase-controlled) loop, and the output signal-of the voltage-controlled oscillator circuit 1 is fed back to be phase-synchronous with the VIF signal. On the other hand, the phase shifter circuit 4, the phase detector circuit 5 and the low-pass filter 6 constitute a synchronous detector circuit. The synchronous detector circuit detects the output signal of the voltage-controlled oscillator circuit 1 and the VIF signal to take out a video signal.

The oscillation frequency $f_{VCO}$ of the voltage-controlled oscillator circuit 1 is fed back and is phase-synchronized with the VIF signal so that the VIF signal frequency becomes equal to $f_{VCO}$. Therefore, error voltage $V_{err}$ output from the low-pass filter 3 also changes following this feedback control. When a voltage $V_{ref}$ of the reference voltage circuit 21 is set equal to the error voltage $V_{err}$ that is obtained when the oscillation frequency $f_{VCO}$ is equal to the video intermediate frequency $f_{IF}$ the output signal of the voltage comparator circuit 22 becomes zero when $f_{VCO}=f_{IF}$. As $f_{VCO}$ gradually deviates from $f_{IF}$ the output voltage of the voltage comparator circuit 22 becomes larger.

As the frequency of the VIF signal is equal to $f_{VCO}$, the output of the voltage comparator circuit 22 changes according to the size of the difference between the VIF signal frequency and $f_{IF}$ starting from when the frequency of the VIF signal=$f_{IF}$ as the center. An unnecessary component of this output signal is removed by the low-pass filter 23, and a result of this filtering is used as an automatic frequency tuning control voltage (AFT output) for feedback controlling the oscillation frequency that is output by the local oscillator of the tuner.

Thus, in the conventional AFT circuit, the error voltage $V_{err}$ is compared with the reference voltage $V_{ref}$, and the AFT output is obtained based on this comparison. Therefore, there has been a problem that the error voltage $V_{err}$ is greatly affected by variations in circuits within the APC loop such as the offset in the phase detector circuit 2 and temperature characteristics of the voltage-controlled oscillator circuit 1, and the AFT output varies due to these variations.

SUMMARY OF THE INVENTION

It is an object of the present invention to provide an AFT circuit that is not dependent on variations such as offset and temperature characteristics.

According to the AFT circuit of one aspect of the present invention, a first output signal generated by a conventional automatic phase-controlled loop circuit and a second output signal generated by a phase-locked loop circuit structured based on a predetermined reference signal are multiplied together. A phase difference detector circuit and an edge detector circuit input a result of this multiplication, and output a result of an edge detection such as a signal of a pulse density corresponding to a frequency difference between the video intermediate frequency and the first output signal. An AFT output is obtained based on a result of this output. As a result, it is possible to obtain the AFT output that is dependent on only the predetermined reference signal.

Further, the phase-locked loop circuit has a frequency divider circuit for setting a frequency of the second output signal to a sum of the video intermediate frequency and the frequency of the reference signal. Since the phase-locked loop circuit is provided with a frequency divider circuit, it is possible to obtain a signal having a frequency that is a sum of the predetermined video intermediate frequency and the frequency of the reference signal as the second signal that is output from the phase-locked loop circuit according to the setting of a frequency dividing ratio of this frequency divider circuit.

Further, the phase-locked loop circuit has a frequency divider circuit for setting a frequency of the second output signal to a difference between the video intermediate frequency and the frequency of the reference signal. Since the phase-locked loop circuit is provided with a frequency divider circuit, it is possible to obtain a signal having a frequency that is a difference between the predetermined video intermediate frequency and the frequency of the reference signal as the second signal that is output from the phase-locked loop circuit according to the setting of a frequency dividing ratio of this frequency divider circuit.

Further, the reference signal is generated based on a sub-carrier frequency of a video color signal. Since a sub-carrier frequency usually generated in a television receiver is used as the reference signal, it is not necessary to prepare a special circuit for generating the reference signal.

According to the AFT circuit of another aspect of the present invention, a first output signal generated by a conventional automatic phase-controlled loop circuit and a reference signal generated based on a signal of a video intermediate frequency are multiplied together. A phase difference detector circuit and an edge detector circuit input a result of this multiplication, and output a result of an edge detection such as a signal of a pulse density corresponding to a frequency difference between the video intermediate frequency and the first output signal. An AFT output is obtained based on a result of this output. As a result, it is possible to obtain the AFT output that is dependent on only the predetermined reference signal. At the same time, it is possible to exclude a phase-locked loop circuit that generates a stable signal for carrying out a multiplication with the first output signal.

Further, the reference signal is a signal having a frequency that is one half of the video intermediate frequency. Therefore, it is possible to select one half of a video intermediate frequency as the frequency of the reference signal.

Further, the edge detector circuit carries out an edge detection by using a trigger clock as the reference signal. Since the edge detector circuit uses a trigger clock as the reference signal, it is possible to depend on the stability of the reference signal for carrying out the edge detection.

Further, the AFT control voltage generator circuit generates an AFT control voltage that resultantly changes linearly in proportion to a difference between the frequency of the video intermediate signal and the video intermediate frequency. Therefore, in a similar manner to that of the analog AFT circuit, it is possible to obtain an AFT output that changes linearly according to a frequency difference between the frequency of the video intermediate signal and the video intermediate frequency.

Further, the AFT control voltage generator circuit generates the AFT control voltage by integrating a signal obtained based on a result of an edge detection of the edge detector circuit. Therefore, it is possible to structure the AFT control voltage generator circuit by a low-pass filter and a charge pump circuit.

Other objects and features of this invention will become apparent from the following description with reference to the accompanying drawings.

BRIEF DESCRIPTION OF THE DRAWINGS

FIG. 3 is a diagram for explaining a relationship between output signals of a phase detector circuit, an edge detector circuit, a charge pump circuit and a low-pass filter respectively in the AFT circuit relating to the first embodiment of the invention.

FIG. 4 is a diagram for explaining a relationship between output signals of a phase detector circuit, an edge detector circuit, a charge pump circuit, and a low-pass filter, respectively, in the AFT circuit relating to the first embodiment of the invention.

FIG. 5 is a block diagram showing a schematic construction of an AFT circuit relating to a second embodiment of the present invention.

DESCRIPTION OF THE PREFERRED EMBODIMENTS

Preferred embodiments of an AFT circuit relating to the present invention will be explained in detail with reference to the drawings. It is to be noted that the present invention is not limited to the following embodiments.

Figure 1:
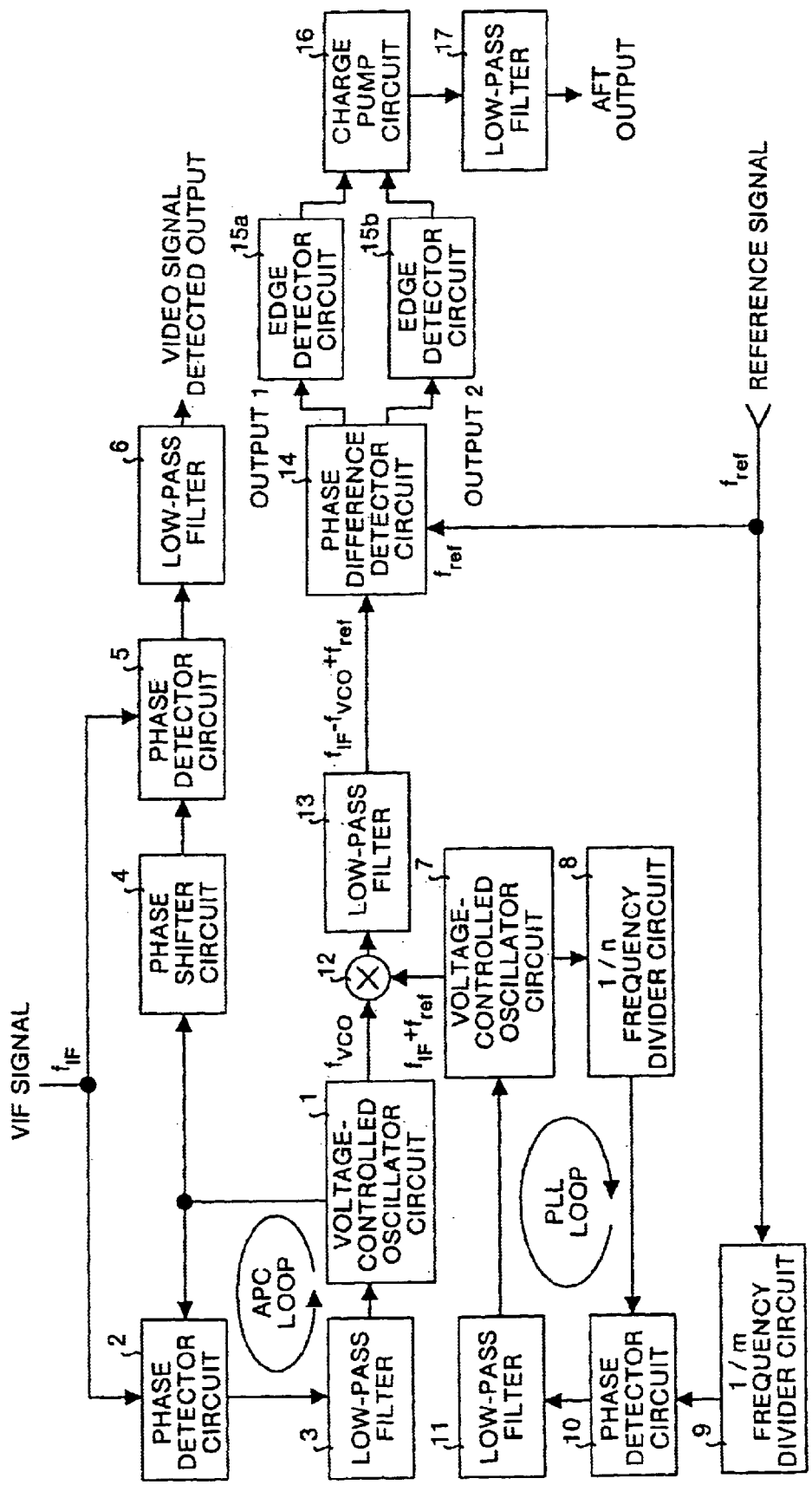
FIG. 1 is a block diagram showing a schematic construction of an AFT circuit relating to a first embodiment of the present invention.

An AFT circuit relating to a first embodiment will be explained here. FIG. 1 is a block diagram showing a schematic construction of an AFT circuit relating to the first embodiment. In FIG. 1, portions common to those in FIG. 7 are attached with identical reference symbols, and their explanation will be omitted.

Figure 7:
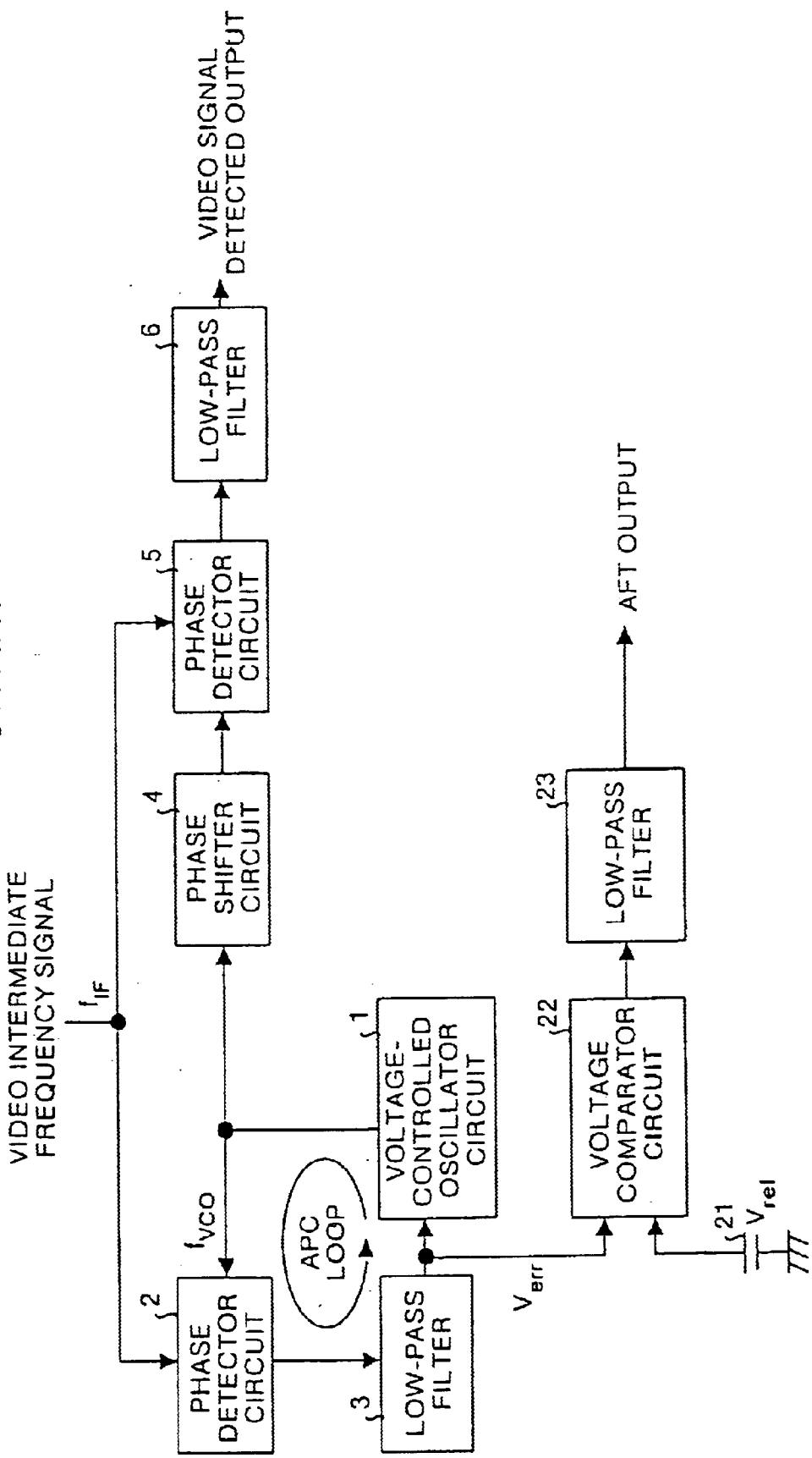
FIG. 7 is a block diagram showing a schematic construction of a conventional AFT circuit.

The AFT circuit shown in FIG. 1 excludes the reference voltage circuit 21, the voltage comparator circuit 22 and the low-pass filter 23 shown in FIG. 7, and includes a second voltage-controlled oscillator circuit 7 capable of controlling an oscillation frequency based on a voltage, a first frequency divider circuit 8 for dividing a frequency of an output signal of the first voltage-controlled oscillator circuit 1 into n, a second frequency divider circuit 9 for dividing the reference signal $f_{ref}$ into m, a phase detector circuit 10 for detecting phases of an output signal of the first frequency divider circuit 8 and an output signal of the second frequency divider circuit 9, and a low-pass filter 11 for integrating an output signal of the phase detector circuit 10.

Further, the AFT circuit includes a multiplier circuit 12 for multiplying an output signal of the first voltage-controlled oscillator circuit 1 and an output signal of the second voltage-controlled oscillator circuit 7 together, a low-pass filter 13 for removing a high-pass component of an output signal of the multiplier circuit 12, a phase difference detector circuit 14 for detecting a phase difference between a signal obtained by the low-pass filter 13 and the reference signal $f_{ref}$, a first edge detector circuit 15a and a second edge detector circuit 15b for detecting an edge portion of a signal output from the phase difference detector circuit 14 by using a trigger clock as the reference signal $f_{ref}$, a charge pump circuit 16 that is driven by pulses output from the first edge detector circuit 15a and the second edge detector circuit 15b, and a low-pass filter 17 for integrating an output signal of the charge pump circuit 16.

Particularly, the output signal of the second voltage-controlled oscillator circuit 7 is input to the first frequency divider circuit 8 and is frequency-divided into n frequencies. After that, the frequency-divided signal is input to the phase detector circuit 10 as one signal to be phase-detected. A result of the phase detection of the phase detector circuit 10 is input to the second voltage-controlled oscillator circuit 7 as its control voltage via the low-pass filter 11. In other words, the second voltage-controlled, oscillator circuit 7, the first frequency divider circuit 8, the phase detector circuit 10 and the low-pass filter 11 constitute a phase-locked loop (PLL). Further, the reference signal $f_{ref}$ that has been frequency-divided into m frequencies by the second frequency divider circuit 9 is input to the phase detector circuit 10 as the other signal to be phase-detected.

Operation of the AFT circuit related to the first embodiment will be explained next. The operation of detecting a video intermediate frequency signal is not different from that used to be performed conventionally. Therefore, only the automatic frequency tuning (AFT) operation will be explained here.

The frequency dividing ratio of the first frequency divider circuit 8 to the second frequency divider circuit 9 is set to n/m=$f_{IF}/f_{ref}$+1 so that the output signal of the second voltage-controlled oscillator circuit 7 is oscillated in the frequency $f_{IF}+f_{ref}$.

Then, the multiplier circuit 12 multiplies an output signal having the frequency $f_{VCO}$ of the first voltage-controlled oscillator circuit 1 with an output signal having the frequency $f_{IF}+f_{ref}$ of the second voltage-controlled oscillator circuit 7 that has been generated by the PLL. Then, a signal having frequency components of $(f_{IF}+f_{VCO})+f_{ref}$ and $(f_{IF}-f_{VCO})+f_{ref}$ is output. The signal having these frequency components is passed through the low-pass filter 13 so that the high-pass component $(f_{IF}+f_{VCO})+f_{ref}$ is removed, and a signal having only the frequency $(f_{IF}-f_{VCO})+f_{ref}$ is finally obtained.

Figure 2:
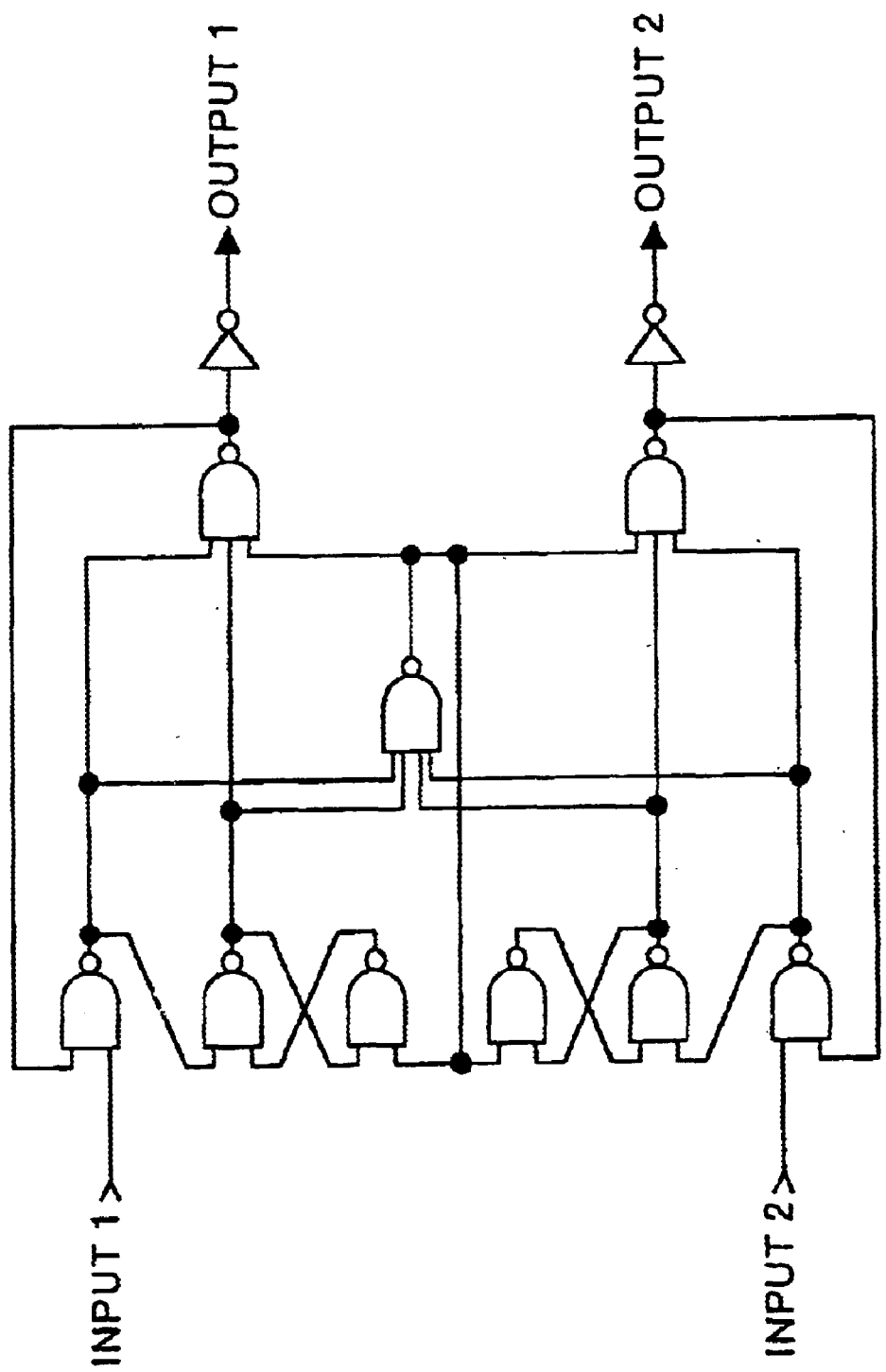
FIG. 2 is a circuit diagram showing one example of a phase detector circuit of the AFT circuit relating to the first embodiment of the invention.

Further, the signal having the frequency $(f_{IF}-f_{VCO})+f_{ref}$ output from the low-pass filter 13 is input into the phase difference detector circuit 14. FIG. 2 is circuit diagram showing an example of the structure of a phase difference detector circuit. Such a phase difference detector circuit is conventionally known. Therefore, detailed explanation of the circuit construction and operation of the phase difference detector will be omitted. In short, the phase difference detector circuit detects a phase difference between a signal input to an input 1 and a signal input to an input 2, and generates a pulse (an error signal) having a length corresponding to this phase difference.

The repetition cycle of this error signal corresponds to a difference of frequencies between the signal input to the input 1 and the signal input to the input 2. The phase difference detector circuit shown in FIG. 2 has two outputs of an output 1 and an output 2. An error signal is output from only one of the output 1 and the output 2 based on a relative phase relationship between the input 1 and the input 2. For example, when the phase of the input 1 is advanced as compared with the phase of the input 2 (or the frequency of the input 1 is higher than that of the input 2), an error signal is output from the output 1. On the other hand, when the phase of the input 1 is delayed as compared with the phase of the input 2 (or the frequency of the input 1 is lower than that of the input 2), an error signal is output from the output 2.

An error signal output from the output 1 of the phase difference detector circuit 14 is input to the first edge detector circuit 15a, and an error signal output from the output 2 of the phase difference detector circuit 14 is input to the second edge detector circuit 15b. An edge of each error signal is detected using a trigger clock as the reference signal $f_{ref}$.

A result of the edge detection that has been output from the first edge detector circuit 15a or the second edge detector circuit 15b is input to the charge pump circuit 16, and is then input to the low-pass filter 17, and the result is integrated. A result of this integration becomes an AFT output, which becomes a control voltage for feedback controlling the oscillation frequency output from the local oscillator of the tuner.

FIG. 3 and FIG. 4 are explanatory diagrams for explaining a relationship between an output signal of the phase difference detector circuit 14, an output signal of the first edge detector circuit 15a or the second edge detector circuit 15b, and an integration output that is produced as an AFT output by the charge pump circuit 16 and the low-pass filter 17. Particularly, FIG. 3 shows a case where a difference of frequencies between $f_{IF}$ and $f_{VCO}$ is large, and FIG. 4 shows a case where a difference of frequencies between $f_{IF}$ and $f_{VCO}$ is small.

First, after the signal of the frequency $(f_{IF}-f_{VCO})+f_{ref}$ and the reference signal $f_{ref}$ have been input to the phase difference detector circuit 14, when the difference of the frequencies between $(f_{IF}-F_{VCO})+f_{ref}$ and the reference signal $f_{ref}$ is large, that is, when the difference of the frequencies between $f_{IF}$ and $f_{VCO}$ is large, the repetition cycle of the error signal becomes short as shown in FIG. 3a). On the other hand, when the difference of the frequencies between $f_{IF}$ and $f_{VCO}$ is small, the repetition cycle of the error signal becomes long as shown in FIG. 4a).

In the phase difference detector circuit 14 shown in FIG. 2, the output routes are different between the case of $f_{IF}>f_{VCO}$ and the case of $f_{IF}<f_{VCO}$ as described above. When $f_{IF}>f_{VCO}$, the error signal is output to the output 1, and when $f_{IF}<f_{VCO}$, the error signal is output to the output 2. When $f_{VCO}=f_{IF}$, no error signal is output to the output 1 or the output 2.

The error signal that has been output from the output 1 or the output 2 of the phase difference detector circuit 14 is output to the first edge detector circuit 15a and the second edge detector circuit 15b provided corresponding to the output 1 and the output 2 respectively. When the difference of the frequencies between $f_{IF}$ and $f_{VCO}$ is large, a pulse signal having a high pulse density of the error signal is output as shown in FIG. 3b). On the other hand, when the difference of the frequencies between $f_{IF}$ and $f_{VCO}$ is small, a pulse signal having a low pulse density of the error signal is output as shown in FIG. 4b). In other words, the first edge detector circuit 15a and the second edge detector circuit 15b output signals of different pulse densities according to the difference of the frequencies between $f_{IF}$ and $f_{VCO}$.

The pulse signals that have been output from the first edge detector circuit 15a and the second edge detector circuit 15b are integrated by the charge pump circuit 16 and the low-pass filter 17. For the pulse signal having a high pulse density, a DC voltage of the integrated result becomes high. On the other hand, for the pulse signal having a low pulse density, a DC voltage of the integrated result becomes low. Accordingly, the voltage changes according to the difference of the frequencies between $f_{IF}$ and $f_{VCO}$ When the difference of the frequencies between $f_{IF}$ and $f_{VCO}$ is large, the DC voltage becomes high as shown in FIG. 3c). On the other hand, when the difference of the frequencies between $f_{IF}$ and $f_{VCO}$ is small, the DC voltage becomes low as shown in FIG. 4c). With the frequencies $f_{VCO}=f_{IF}$ as the center, DC voltages of opposite polarities are obtained between the case of $f_{IF}>f_{VCO}$ and the case of $f_{IF}<f_{VCO}$. This DC voltage becomes the AFT output.

As explained above, according to the AFT circuit relating to the first embodiment, the AFT output is obtained based on the frequency and the phase of the reference signal $f_{ref}$. Therefore, the stability of the AFT output depends on only the stability of the reference signal $f_{ref}$. Accordingly, when a stable signal source like a crystal oscillator circuit is used for generating the reference signal, it is possible to achieve an AFT circuit that is not affected by an offset or temperature characteristics.

A digital AFT circuit that pulse-counts the oscillation frequency of the voltage-controlled oscillator circuit 1 can also achieve an AFT circuit that is less affected by the variation factors. However, the AFT output of this AFT circuit can take only a discrete value. On the other hand, the AFT circuit relating to the first embodiment has also a feature that the AFT output changes linearly according to the frequency difference between $f_{IF}$ and $f_{VCO}$, in a similar manner to that of the conventional analog AFT circuit.

It is assumed in the above explanation that the oscillation frequency of the second voltage-controlled oscillator circuit 7 is $f_{IF}+f_{ref}$. However, it is needless to mention that a similar effect can also be enjoyed when the oscillation frequency of the second voltage-controlled oscillator circuit 7 is $f_{IF}-f_{ref}$ or $f_{ref}-f_{IF}$.

An AFT circuit relating to a second embodiment of the invention will be explained next. The AFT circuit relating to the second embodiment is characterized in that the reference signal explained in the AFT circuit relating to the first embodiment is used as a color signal sub-carrier frequency ($f_{SC}$) usually used in a television receiver.

FIG. 5 is a block diagram showing a schematic construction of the AFT circuit relating to the second embodiment of the present invention. The portions common to those in FIG. 1 are attached with identical reference symbols, and their explanation will be omitted. FIG. 5 shows a crystal oscillator circuit 18 capable of controlling the oscillation frequency based on a voltage, a phase detector circuit 19 for detecting phases of a color signal of a video signal and an output signal of the crystal oscillator circuit 18 at the timing of a burst signal, and a low-pass filter 20 for integrating an output signal of the phase detector circuit 19.

A television receiver uses a color signal sub-carrier frequency ($f_{SC}$) as a reference signal for demodulating a color signal, and generally has an APC loop circuit constructed of a crystal oscillator circuit 18, a phase detector circuit 19 and a low-pass filter 20, for phase-synchronizing the color signal sub-carrier frequency ($f_{SC}$) with a burst signal of the video signal, as shown in FIG. 5. As a $f_{SC}$ signal obtained in this way is phase-synchronized with the burst signal, this has been known as a very stale signal source.

In the AFT circuit relating to the second embodiment, the color signal sub-carrier frequency $f_{SC}$ is used as the reference signal, and the frequency dividing ratio of the first frequency divider circuit 8 to the second frequency divider circuit 9 is set to $n/m=f_{IF}/f_{SC}+1$ so that the signal frequency of the second voltage-controlled oscillator circuit 7 becomes $f_{IF}+f_{SC}$. Other operation of the AFT circuit is quite similar to that of the AFT circuit relating to the first embodiment except that the frequency of the reference signal becomes $f_{SC}$ and the relationship of frequencies between functional blocks changes, and therefore, their explanation will be omitted.

As explained above, according to the AFT circuit relating to the second embodiment, the reference signal to be input to the second frequency divider circuit and the phase detector circuit 14 as explained in the first embodiment is changed to the color signal sub-carrier frequency $f_{SC}$ signal. Therefore, by sharing the reference signal source with the color signal demodulator circuit, it becomes possible to further stabilize the reference signal and to minimize the circuit scale.

It is needless to mention that a similar effect can also be enjoyed when the oscillation frequency of the second voltage-controlled oscillator circuit 7 is set to $f_{IF}-f_{SC}$ or $f_{SC}-f_{IF}$.

An AFT circuit relating to a third embodiment of the invention will be explained next. The AFT circuit relating to the third embodiment is characterized in that the reference signal explained in the AFT circuit relating to the first embodiment is set to have one half of the video intermediate frequency, that is a signal of $f_{IF}/2$.

Figure 6:
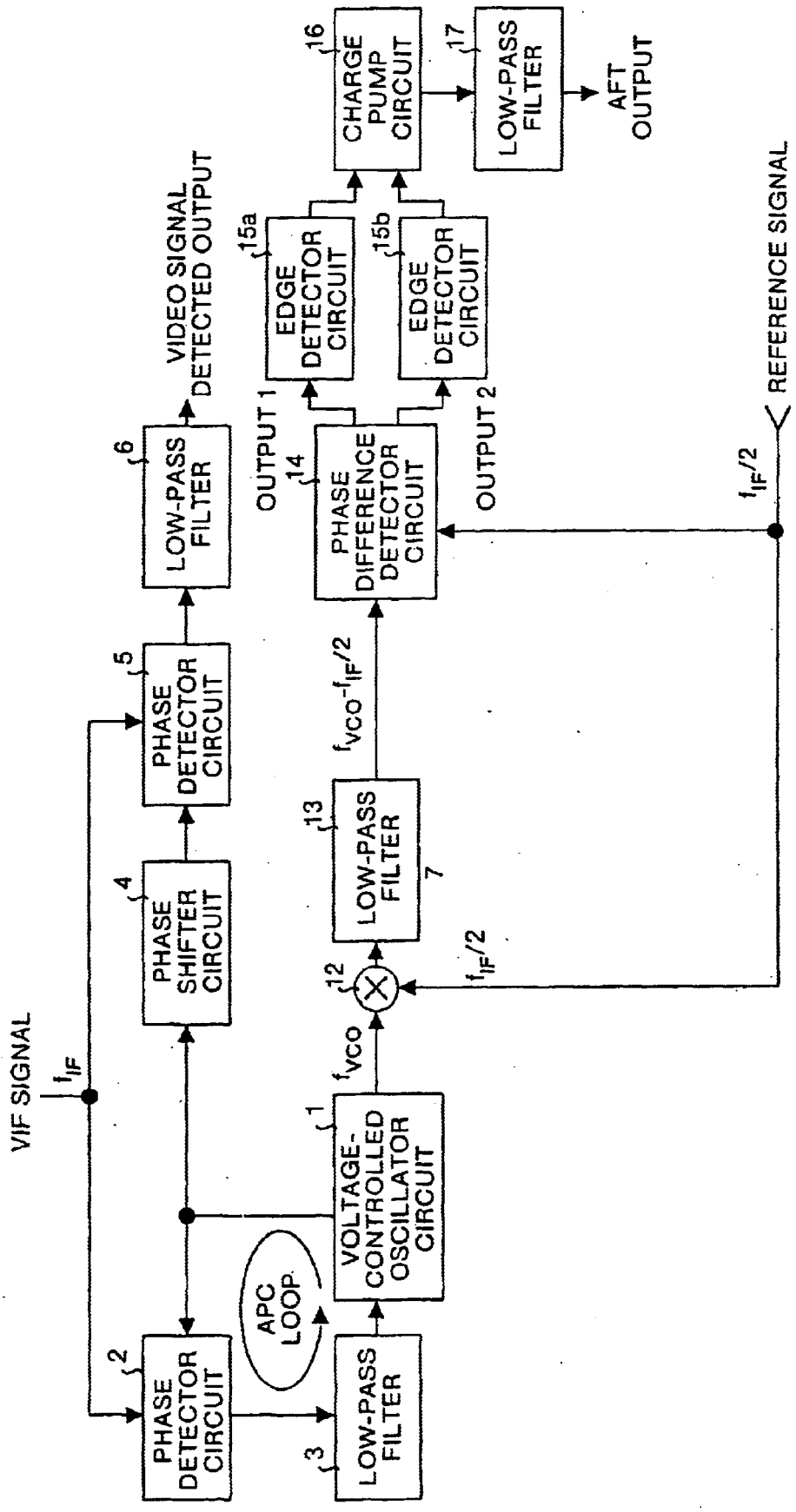
FIG. 6 is a block diagram showing a schematic construction of an AFT circuit relating to a third embodiment of the present invention.

FIG. 6 is a block diagram showing a schematic construction of the AFT circuit relating to the third embodiment of the present invention. The portions common to those in FIG. 1 are attached with identical reference symbols, and their explanation will be omitted. Particularly, in the AFT circuit shown in FIG. 6, the reference signal of $f_{IF}/2$ is directly input to the multiplier circuit 12 as a signal to be multiplied with the signal of $f_{VCO}$ that is output from the first voltage-controlled oscillator circuit 1. Therefore, it is possible to exclude the PLL circuit constituted by the second voltage-controlled oscillator circuit 7, the first frequency divider circuit 8, the second frequency divider circuit 9, the phase detector circuit 10 and the low-pass filter 11 explained in the first embodiment.

Accordingly, other operation of the AFT circuit is quite similar to that of the AFT circuit relating to the first embodiment except that the frequency $f_{ref}$ of the reference signal becomes $f_{IF}/2$ and the output signal of the low-pass filter 13 becomes $f_{VCO}-f_{IF}/2$, and therefore, their explanation will be omitted.

As explained above, according to the AFT circuit relating to the third embodiment, the frequency of the reference signal is set to $f_{IF}/2$, and this reference signal is directly input to the multiplier circuit 12 as a signal to be multiplied with the signal of $f_{VCO}$ that is output from the first voltage-controlled oscillator circuit 1. Therefore, it becomes possible to exclude the PLL circuit that has been necessary in the AFT circuit relating to the first embodiment. As a result, it is possible to substantially reduce the circuit scale.

As explained above, according to the present invention, a first output signal generated by a conventional automatic phase-controlled loop circuit and a second output signal generated by a phase-locked loop circuit structured based on a predetermined reference signal are multiplied together. A phase difference detector circuit and an edge detector circuit input a result of this multiplication, and output a result of an edge detection such as a signal of a pulse density corresponding to a frequency difference between the video intermediate frequency and the first output signal. An AFT output is obtained based on a result of this output. As a result, it is possible to obtain the AFT output that is dependent on only the predetermined reference signal. Further, there is an effect that when a stable signal source like a crystal oscillator circuit is used for generating a reference signal, it is possible to achieve an AFT circuit that is not affected by an offset or temperature characteristics.

Further, the phase-locked loop circuit is provided with a frequency divider circuit. Accordingly, there is an effect that it is easily possible to obtain a signal having a frequency that is a sum of the predetermined video intermediate frequency and the frequency of the reference signal as the second signal that is output from the phase-locked loop circuit according to the setting of a frequency dividing ratio of this frequency divider circuit.

Further, the phase-locked loop circuit is provided with a frequency divider circuit. Accordingly, there is an effect that it is easily possible to obtain a signal having a frequency that is a difference between the predetermined video intermediate frequency and the frequency of the reference signal as the second signal that is output from the phase-locked loop circuit according to the setting of a frequency dividing ratio of this frequency divider circuit.

Further, a sub-carrier frequency usually generated in a television receiver is used as the reference signal. Accordingly, it is not necessary to prepare a special circuit for generating the reference signal. As a result, there is an effect that it is possible to minimize the scale of an AFT circuit, and to construct a simple and stable AFT circuit at low cost.

Further, according to the present invention, a first output signal generated by a conventional automatic phase-controlled loop circuit and a reference signal generated based on a signal of a video intermediate frequency are multiplied together. A phase difference detector circuit and an edge detector circuit input a result of this multiplication, and output a result of an edge detection such as a signal of a pulse density corresponding to a frequency difference between the video intermediate frequency and the first output signal. An AFT output is obtained based on a result of this output. As a result, it is possible to obtain the AFT output that is dependent on only the predetermined reference signal. At the same time, it is possible to exclude a phase-locked loop circuit that generates a stable signal for carrying out a multiplication with the first output signal. As a result, there is an effect that it is possible to achieve an AFT circuit that is not affected by an offset or temperature characteristics and to minimize the AFT circuit. Further, it is possible to select one half of a video intermediate frequency as the frequency of the reference signal. Therefore, there is an effect that it is easy to design an AFT circuit when a signal of the video intermediate frequency is to be introduced as the reference signal.

Further, the edge detector circuit uses a trigger clock as the reference signal. Accordingly, it is possible to depend on the stability of the reference signal for carrying out the edge detection. As a result, there is an effect that it is possible to achieve a more stable AFT circuit that is not affected by an offset or temperature characteristics.

Further, the AFT control voltage generated in the AFT control voltage generator circuit resultantly changes linearly in proportion to a difference between the frequency of the video intermediate signal and the video intermediate frequency. Therefore, as against the conventional digital AFT circuit, there is an effect that it is possible to obtain an AFT output that changes linearly according to a frequency difference between the frequency of the video intermediate signal and the video intermediate frequency in a similar manner to that of the analog AFT circuit.

Further, the AFT control voltage generator circuit generates the AFT control voltage by integrating a signal obtained based on a result of an edge detection of the edge detector circuit. Therefore, there is an effect that it is easily possible to structure the AFT control voltage generator circuit by a low-pass filter and a charge pump circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An automatic frequency tuning (AFT) circuit comprising:
   an automatic phase-controlled loop circuit having a first voltage-controlled oscillator circuit which outputs a first output signal having an oscillation frequency according to a first control voltage, and a first phase detector circuit which detects phases of a video intermediate signal output from a tuner and the first output signal, wherein a signal obtained based on a result of phase detection by said first phase detector circuit is input into said first voltage-controlled oscillator circuit as the first control voltage;
   a phase-locked loop circuit having a second voltage controlled oscillator circuit which outputs a second output signal having an oscillation frequency according to a second control voltage, and a second phase detector circuit which detects phases of a reference signal having a frequency and the second output signal, wherein a signal obtained based on a result of phase detection by said second phase detector circuit is input into said second voltage-controlled oscillator circuit as the second control voltage;
   a multiplier circuit which multiplies the first output signal with the second output signal;
   a phase difference detector circuit which detects a phase difference between a signal obtained based on a result of multiplication by said multiplier circuit and the reference signal;
   an edge detector circuit which detects an edge of a signal obtained based on a result of phase detection by said phase difference detector circuit; and
   an AFT control voltage generator circuit that generates control voltage for feedback control of said tuner so that the frequency of the video intermediate signal has specified video intermediate frequency, based on a result of edge detection by said edge detector circuit.

2. The AFT circuit according to claim 1, wherein said phase-locked loop circuit has a frequency divider circuit for setting a frequency of the second output signal to a sum of the video intermediate frequency and the frequency of the reference signal.

3. The AFT circuit according to claim 1, wherein said phase-locked loop circuit has a frequency divider circuit for setting a frequency of the second output signal to a difference between the video intermediate frequency and the frequency of the reference signal.

4. The AFT circuit according to claim 1, wherein the reference signal is generated based on a sub-carrier frequency of a video color signal.

5. The AFT circuit according to claim 1, wherein said edge detector circuit carries out edge detection using a trigger clock as the reference signal.

6. The AFT circuit according to claim 1, wherein said AFT control voltage generator circuit generates an AFT control voltage that changes linearly in proportion to a difference between the frequency of the video intermediate signal and the video intermediate frequency.

7. The AFT circuit according to claim 1, wherein said AFT control voltage generator circuit generates the AFT control voltage by integrating a signal based on a result of edge detection by said edge detector circuit.

8. An automatic frequency tuning (AFT) circuit comprising
   an automatic phase-controlled loop circuit having a voltage-controlled oscillator circuit which outputs an output signal having an oscillation frequency according to a control voltage, and a phase detector circuit which detects phases of a video intermediate signal output from a tuner and the output signal, wherein a signal obtained based on a result of phase detection by said phase detector circuit is input into said voltage-controlled oscillator circuit as the control voltage;
   a multiplier circuit which multiplies the output signal with a reference signal generated based on a signal having the video intermediate frequency;

a phase difference detector circuit which detects a phase difference between a signal obtained based on a result of multiplication by said multiplier circuit and the reference signal;

an edge detector circuit which detects an edge of a signal obtained based on a result of phase detection by said phase difference detector circuit; and an AFT control voltage generator circuit that generates control voltage for feedback control of said tuner so that the frequency of the video intermediate signal has specified video intermediate frequency, based on a result of edge detection by said edge detector circuit.

9. The AFT circuit according to claim 8, wherein the reference signal has a frequency that is one half of the video intermediate frequency.

10. The AFT circuit according to claim 8, wherein said edge detector circuit carries out edge detection using a trigger clock as the reference signal.

11. The AFT circuit according to claim 8, wherein said AFT control voltage generator circuit generates an AFT control voltage that changes linearly in proportion to a difference between the frequency of the video intermediate signal and the video intermediate frequency.

12. The AFT circuit according to claim 8, wherein said AFT control voltage generator circuit generates the AFT control voltage by integrating a signal obtained based on a result of edge detection by said edge detector circuit.

* * * * *